(12) United States Patent
Takehara

(10) Patent No.: US 7,015,840 B2
(45) Date of Patent: *Mar. 21, 2006

(54) RESOLVER/DIGITAL CONVERTER

(75) Inventor: Takao Takehara, Tokyo (JP)

(73) Assignee: Minebea Co., Ltd., Nagano-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/792,384

(22) Filed: Mar. 4, 2004

(65) Prior Publication Data

US 2004/0233078 A1 Nov. 25, 2004

(30) Foreign Application Priority Data

Mar. 17, 2003 (JP) ............................. 2003-071581

(51) Int. Cl.
*H03M 1/48* (2006.01)
(52) U.S. Cl. ...................................... 341/116; 341/112
(58) Field of Classification Search ................ 341/116, 341/117
See application file for complete search history.

(56) References Cited

U.S. PATENT DOCUMENTS

| | | | | |
|---|---|---|---|---|
| 4,475,105 A | * | 10/1984 | Kurosawa ............... | 340/870.25 |
| 5,134,404 A | * | 7/1992 | Peterson ..................... | 341/116 |
| 5,455,498 A | * | 10/1995 | Kakimoto et al. .......... | 318/605 |
| 5,949,359 A | * | 9/1999 | Vlahu ......................... | 341/116 |
| 6,188,341 B1 | * | 2/2001 | Taniguchi et al. .......... | 341/116 |
| 6,894,629 B1 | * | 5/2005 | Takehara .................... | 341/116 |
| 2002/0041074 A1 | * | 4/2002 | Benz et al. ................ | 280/93.5 |

FOREIGN PATENT DOCUMENTS

| | | |
|---|---|---|
| EP | 0877489 A | 11/1998 |
| EP | 0978947 A | 2/2000 |
| JP | A-62-38302 | 2/1987 |

* cited by examiner

*Primary Examiner*—Linh V. Nguyen
(74) *Attorney, Agent, or Firm*—Adduci, Mastriani & Schaumberg, L.L.P.

(57) ABSTRACT

An R/D converter allows high precision detection of a rotation angle of a rotor axis of a resolver having high rates of rotation. An A/D converter is built into a digital signal processor and converts a sine wave and cosine wave output from the resolver. An axis angle calculator calculates $\tan\theta = A((\sin\omega t)(\sin\theta))/A((\sin\omega t)(\cos\theta))$ from $A(\sin\omega t)(\sin\theta)$ and $A(\sin\omega t)(\cos\theta)$ and further calculates $\theta = \tan^{-1}\theta$. The angle space is divided into quadrants and an offset value is set for each quadrant and by adding or subtracting the calculated $\theta$ to or from the offset value to form the final angle of the rotor axis of the resolver.

15 Claims, 3 Drawing Sheets

RESOLVER/DIGITAL CONVERTER

CROSS REFERENCE TO RELATED APPLICATION

This application is based on and incorporates by reference Japanese Patent Application No. 2003-071581 filed on Mar. 17, 2003.

BACKGROUND OF THE INVENTION

The present invention relates to digital converters, and more particularly, to a converter for digitizing the rotational output of a resolver.

A resolver is a type of rotary transformer typically having two stator windings and one rotor winding on an axis or shaft. A resolver is used for determining the position of the shaft or axis of the rotor, with respect to a reference point, within a space of one complete revolution of the shaft or within a corresponding angular displacement space from 0° to 360°. The two stator windings are mechanically arranged such that their physical relation is shifted by a 90° angle. The physical spacing of the stator windings gives rise to a mathematical/electrical relation in that any signals induced in the stator windings from, for example, a rotor excitation signal, will be correspondingly shifted by 90° leading to the sine and cosine wave function relations assigned to the respective outputs of the stator windings. It will be appreciated that the degree of accuracy of the 90° physical relation based on, for example, accurate placement of stator windings, will affect the degree to which the outputs truly represent a sine and cosine relation. It is understood by those of ordinary skill in the art that the sine and cosine wave functions are mathematically related by a 90° shift.

The amplification of a signal obtained by coupling with the stator windings is a function of the position of the resolver rotor axis and the relative position of the stator windings. Therefore, two types of output voltages (S3-S1, S4-S2) are modulated according to a sine wave function and a cosine wave function corresponding to the axis angle of the resolver rotor relative to the stator windings. The output voltage waveforms can be expressed in the following formulae (1) and (2).

$$S3-S1 = A(\sin \omega t)(\sin \theta) \quad (1)$$

$$S4-S2 = A(\sin \omega t)(\cos \theta) \quad (2)$$

where "$\theta$" is the angle of the resolver rotor axis, "$\omega$" is the angular velocity corresponding to the rotor excitation frequency (f), and "A" is the rotor excitation amplification.

Proposals have been set forth for Resolver/Digital (R/D) converters in which, of the continuous output voltage signals S3-S1 and S4-S2, the signal with the smaller absolute value or magnitude is divided by the signal with the larger absolute value and, based on a resulting continuous signal associated with the quotient, the angle data is obtained. An example of such a proposed R/D converter may be seen, for example, in Japanese Unexamined Patent Application Publication S62-38302. Therein, tan $\theta$ and cot $\theta$ are calculated from output voltages S3-S4, S4-S2. At the same time, a digital code, or the like, for A(sin $\omega$t) is determined from the output voltage S3-S1, the digital code result such as an index or the like, and the angle section of the resolver rotor axis obtained from the digital code result or index. As noted, one of either tan $\theta$ or cot $\theta$ may be used as a digital code, and angle data associated with resolver rotor axis angle $\theta$ and corresponding to the digital code or index and stored in advance in the table converter, is read and output.

Problems arise however, since the proposed R/D converter mentioned above requires angle data, in a range of 0° to 360° corresponding to the digital codes or indexes determined from output voltages, to be stored in the table converter. When high precision is required, memory capacity must be increased since a greater number of angle data values must be stored. In addition, the continuous calculation of quotients, namely tan $\theta$ and cot $\theta$, with a microcomputer involves a long calculation time, thereby making it less desirable or effective in an operational environment where quantities associated with a high rate of rotation of the resolver rotor axis are present.

SUMMARY OF THE INVENTION

Accordingly, an object of the present invention is to provide an R/D converter which is capable of high precision detection of the rotation angle of a resolver rotor axis.

Another object of the invention is to provide an R/D converter capable of working effectively in operational environments where a high rate of rotation of the resolver rotor axis is typical.

Thus, the R/D converter of the present invention finds the angle of the resolver rotor axis based on a sine wave output and cosine wave output of the resolver. An A/D converter converts the sine wave output and cosine wave output of the resolver. A digital signal processor calculates the tangent value from the sine wave output and cosine wave output of the resolver digitized by the A/D converter, and directly digitally calculates the angle of the resolver rotor axis by calculating the arc tangent.

In accordance with various exemplary embodiments, the R/D converter of the present invention includes a digital signal processor with a built-in A/D converter which converts the sine wave output and cosine wave output of the resolver into a digitized sine wave and digitized cosine wave respectively. The tangent value may then be calculated from the digitized sine wave and digitized cosine wave output. The arc tangent may then be calculated from the tangent through, for example, an inversion operation, and the angle of the resolver rotor axis is directly digitally calculated, allowing high precision detection of the rotation angle of the resolver rotor axis during high rates of rotation thereof.

In addition, in accordance with various preferred modes and embodiments, the digital signal processor determines into which of four ninety degree quadrants associated with the rotational angle space (0° to 360°) of the resolver rotor axis the present axis position falls. The determination of the quadrant associated with the present position of the resolver rotor axis is based on the polarity of the sine wave output and cosine wave output of the resolver. The final angle of the resolver rotor axis is found by setting an offset value of the angle of the rotor axis based on the determined quadrant.

Further, in accordance with various preferred modes and embodiments, values constituting a sampled sine wave with a designated sampling frequency may be stored in a memory of the digital signal processor, which may then output the stored values based on automatically generated addresses. Accordingly, the values from the memory are converted into an analog signal by the D/A converter and output as a sine wave for resolver excitation.

Still further, in accordance with various preferred modes and embodiments, high frequency components may be removed by quantizing the resolver excitation sine wave output from the D/A converter.

BRIEF DESCRIPTION OF THE DRAWINGS

The accompanying figures, in which like reference numerals refer to identical or functionally similar elements throughout the separate views and which, together with the detailed description below, are incorporated in and form part of the specification, serve to further illustrate various embodiments and to explain various principles and advantages all in accordance with the present invention.

DETAILED DESCRIPTION OF THE PREFERRED EMBODIMENTS

Figure 1:
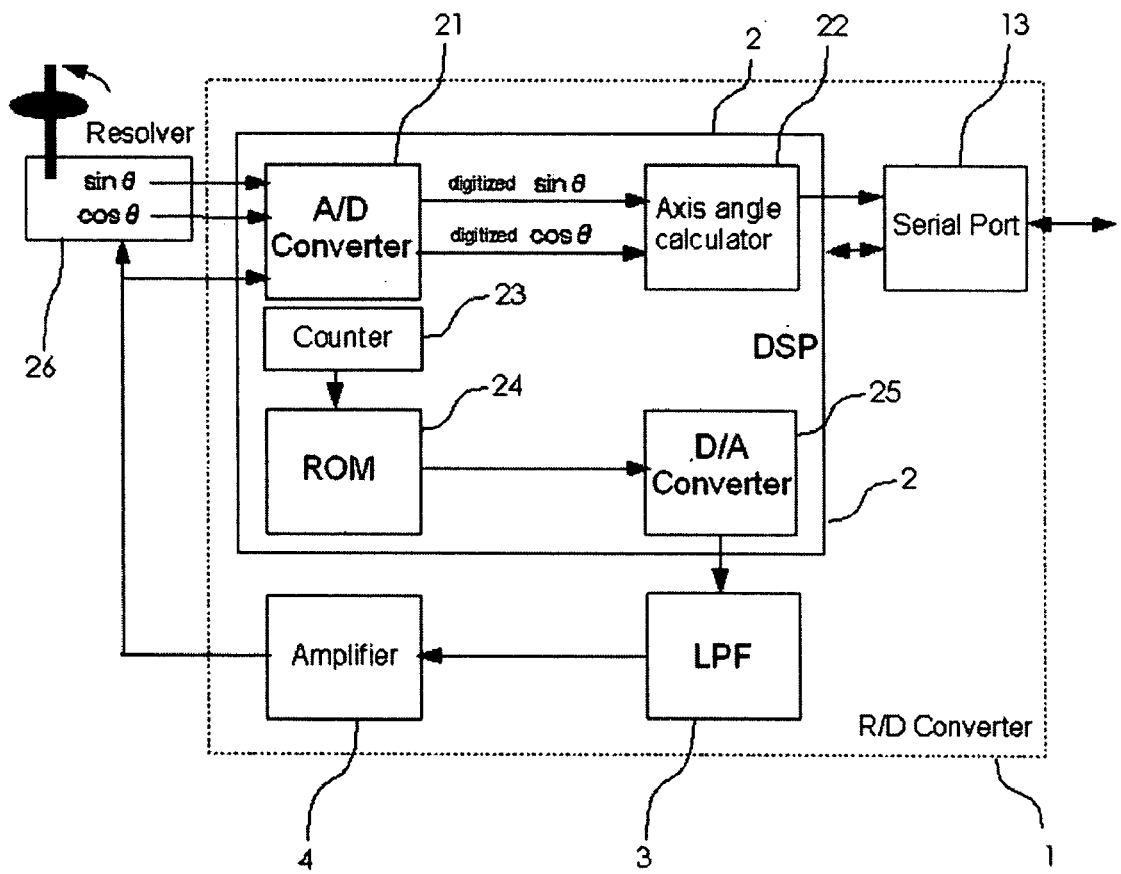
FIG. 1 is a block diagram illustrating structure associated with an exemplary R/D converter according to one embodiment of the present invention.

FIG. 1 is a block diagram illustrating an exemplary structure of R/D converter 1 including Digital Signal Processor (DSP) 2, lowpass filter (LPF) 3, and amplifier 4. DSP 2 calculates an angle associated with the position of the rotor axis of resolver 26, for example from a reference position, reference angle, or the like, based on a sine wave output and cosine wave output of resolver 26. DSP 2 further outputs an excitation sine wave to resolver 26 as follows.

Counter 23 generates addresses for data ROM 24. Data ROM 24 stores the value of the sine wave sampled at the designated sampling frequency, and in accordance with the address from the counter 23, outputs the stored value using direct memory access (DMA) of data ROM 24 as would be understood to one of skill in the art. D/A converter 25 then converts the value from data ROM 24 and outputs the analog value. By repeating the steps of access and conversion an analog signal may be generated and output to the above-mentioned LPF 3. Since the excitation sine wave is likely to contain quantizing noise associated with digital to analog conversion, LPF 3 may be used to remove high frequency components, associated noise spikes or the like of the excitation sine wave. Amplifier 4 amplifies the excitation sine wave from LPF 3 after the high frequency components or the like have been removed and supplies the excitation sine wave to resolver 26. Serial port 13 is connected to DSP 2 and outputs data corresponding to the angle of the rotor axis of resolver 26. It will also be appreciated that serial port 13 may be used, for example by DSP 2, to receive input from an external source.

As shown in FIG. 1, DSP 2 includes A/D converter 21, axis angle calculator 22, counter 23, data ROM 24, and D/A converter 25. A/D converter 21 preferably has, for example, a resolution of 12 to 14 bits, and is used to convert the sine wave output and cosine wave output of resolver 26 from analog to digital. Axis angle calculator 22 calculates $\tan\theta = (A(\sin\omega t)(\sin\theta))/(A(\sin\omega t)(\cos\theta))$ from $A(\sin\omega t)(\sin\theta)$ and $A(\sin\omega t)(\cos\theta)$ output from A/D converter 21, and further calculates $\theta=\tan^{-1}\theta$. However, the tangent function is defined from 0° to 90°, and therefore, in order to develop the tangent result and transform or transpose it to a 360° space, the quadrant of the rotor axis of resolver 26 must be defined based, for example, on the polarity of $\sin\theta$ and $\cos\theta$ using DSP 2 as a discriminator, or the like, for judging or otherwise determining the present quadrant position of the rotor.

Figure 2:
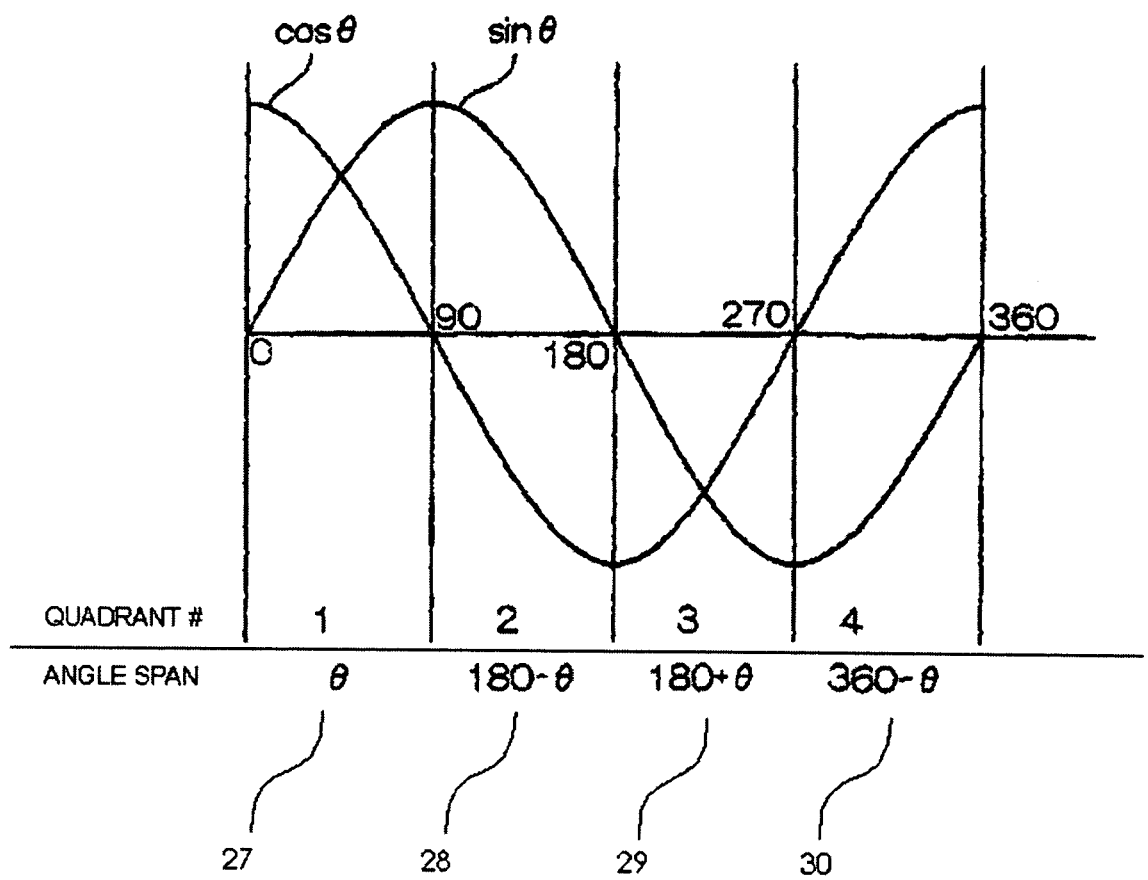
FIG. 2 is a diagram illustrating phase angle and quadrant offsets including first, second, third, and fourth quadrants of an exemplary resolver.

Therefore, axis angle calculator 22 determines a current position or current axis angle of the rotor axis of resolver 26 by checking the polarity of the $\sin\theta$ and $\cos\theta$ output from A/D converter 21. More specifically, the resolver excitation wave output is converted and the polarity of $\sin\theta$ and $\cos\theta$ is determined by comparing the polarity of the sine wave output and the cosine wave output of the resolver, and the quadrant of resolver rotor axis is determined. As shown in FIG. 2, a complete rotational angle space—from 0° to 360°—associated with the rotor axis of resolver 26, is divided into four quadrants, with 0° to 90° set to be first quadrant 27, 90° to 180° set to be second quadrant 28, 180° to 270° set to be third quadrant 29, and 270° to 360° set to be fourth quadrant 30. The offset is set for each quadrant and by adding or subtracting the calculated angle θ to or from an offset associated with each quadrant, axis angle calculator 22 may calculate the final angle of the rotor axis of resolver 26 as will be described in greater detail hereinafter.

Figure 3:
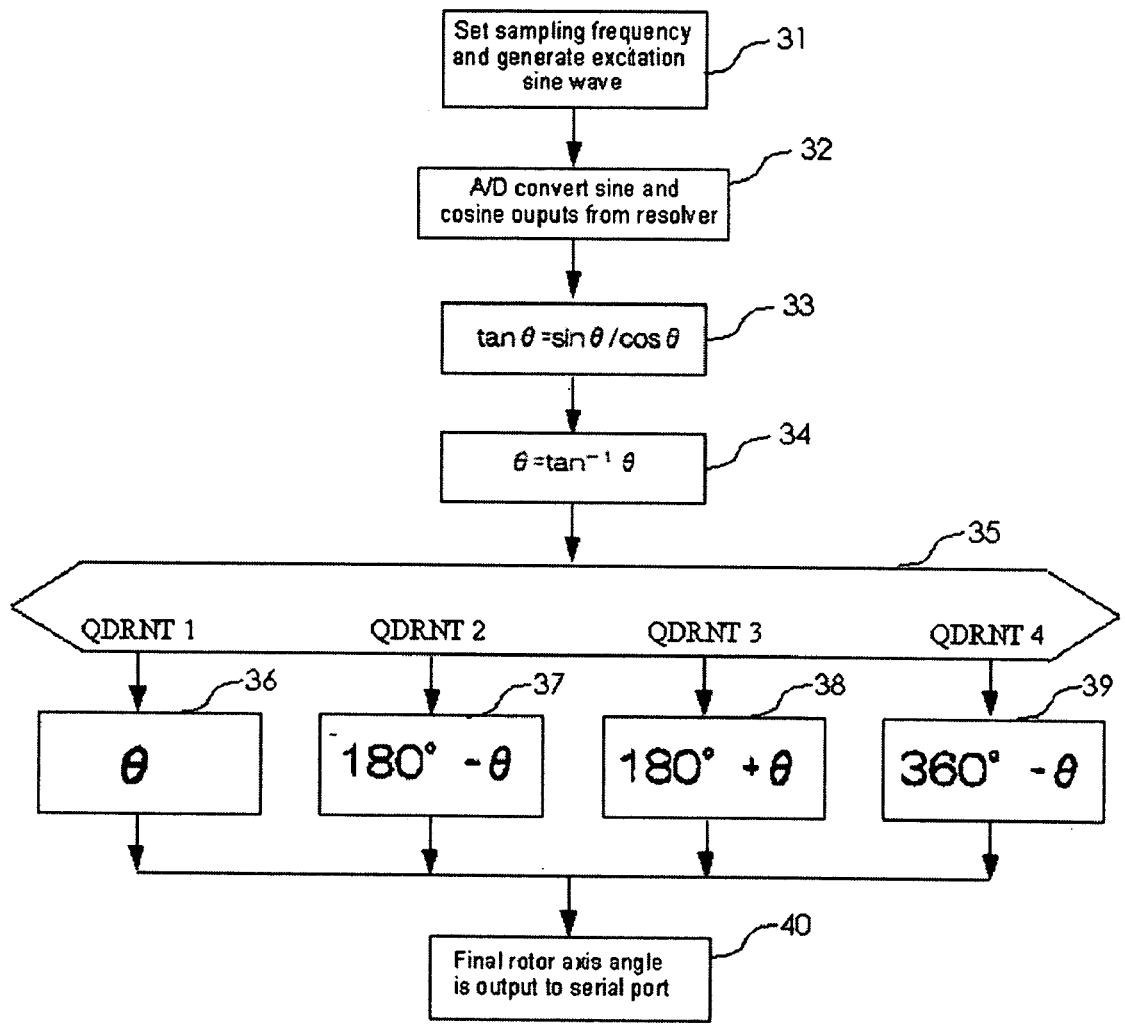
FIG. 3 is a flow chart illustrating the operation of the exemplary R/D converter in accordance with a present embodiment.

Next, exemplary operation of R/D converter 1 in accordance with the present invention as illustrated, for example, in the flow chart of FIG. 3 is described. First, at 31, the sampling frequency (SDFS) of D/A converter 25 is set to 200 KHz, and an excitation sine wave of 200/20=10 KHz is obtained by cyclically transmitting data values stored in ROM 24 at successive addresses using circular addressing generated, for example, by counter 23 as described herein above. After power is turned on, the above-described operation is carried out until the excitation state of the resolver is stabilized, for example, at the end of a known or otherwise predetermined time interval. The time for initial stabilization may be set by a timer (not shown in the drawing) as would be well known to one of ordinary skill in the art.

Next, at 32, the sine wave output and cosine wave output of the resolver are A/D converted with A/D converter 21 into a digitized sine wave and digitized cosine wave. It should be noted that an identical signal is used as a sampling clock for A/D conversion and D/A conversion, for example in connection with the output of the resolver excitation sine wave. It should further be noted that the sine wave output and cosine wave output of resolver 26 are A/D converted at the same time.

Next, at 33, $\tan\theta=(A(\sin\omega t)(\sin\theta))/(A(\sin\omega t)(\cos\theta))$ is calculated from the A/D converted value of the sine wave output and cosine wave output of resolver 26, $A(\sin\omega t)(\sin\theta)$ and $A(\sin\omega t)(\cos\theta)$ using axis angle calculator 22. At 34, $\theta=\tan^{-1}\theta$ is calculated.

At 35, the polarity of the A/D converted output of $\sin\theta$ and $\cos\theta$ is checked using axis angle calculator 22, and the current position, or current axis angle, of the rotor of resolver 26 is determined. If the polarity of the $\sin\theta$ and $\cos\theta$ of the A/D converted output indicates that rotor axis position of resolver 26 is in first quadrant 27 (0° to 90°), θ is set to be the final rotation angle, or final angle, of the rotor axis of resolver 26 at 36. If the polarity indicates that the rotor axis position is in second quadrant 28 (90° to 180°), the value of 180°−θ is set to be the final angle of the rotor axis at 37. If the polarity indicates that the rotor axis position is in third quadrant 29 (180° to 270°), the value of 180°+θ is set to be the final angle of the rotor axis at 38. If the polarity indicates that the rotor axis position is in fourth quadrant 30 (270° to 360°), the value of 360°−θ is set to be the final angle of the rotor axis at 39. Finally, at 40, the final rotation angle of the rotor axis of resolver 26 is output to serial port 13.

It should be noted that although the 12 to 14 bit resolution mentioned above in association with, for example, A/D converter 21, is adequate for conversion, sufficient calculation precision can be obtained and maintained using at least 16 bit precision, or resolution, in calculations performed using DSP 2, even for calculations for determining $\tan^{-1} \theta$. Given the unique characteristics of the tangent function, calculating $\tan \theta$ using at least 16 bit precision and, for example, the relation $\sin \theta / \cos \theta$, the resolution of $\theta$ is not adversely affected particularly in the primary range of interest for initial calculations of $\theta$ of 0° to 90°. Therefore, high precision can be obtained in an R/D converter in accordance with the present invention, for example, using the above described calculations.

It should further be noted that in accordance with various exemplary embodiments, there is no need to synchronize the starting timing of A/D conversion to, for example, a specific phase of the excitation sine wave. An increase in sampling frequency of A/D converter 21 is thereby allowed—to the extent that the increase is supportable by, for example, the processing capacity of DSP 2. Consequently, accurate and efficient operation in an environment associated with a high rate of rotation of the rotor axis of resolver 26, as described above, is possible.

Still further, as described above, because the sine wave output and cosine wave output of resolver 26 are A/D converted by A/D converter 21 into digitized signals, the angle of the rotor axis of resolver 26 may be directly digitally calculated from the digitized sine wave and cosine wave, allowing high precision detection of the rotation angle of the rotor axis of resolver 26 particularly in operational environments characterized by a high rate of rotation of the rotor axis.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

The invention claimed is:

1. A Resolver/Digital (R/D) converter configured to find an angle of a rotor axis of a resolver, the R/D converter comprising:
   a first converter configured to convert a sine wave output and a cosine wave output of said resolver to a digitized sine wave and digitized cosine wave; and
   a digital signal processor including a calculator configured to calculate a tangent from the digitized sine wave and the digitized cosine wave, and directly perform a digital calculation of the angle of said rotor axis of said resolver by calculating an arc tangent from the calculated tangent, the calculated angle being between 0 and 90 degrees,
   wherein:
   said digital signal processor further includes a discriminator for determining to which one of four quadrants formed by dividing an angle space of said resolver into four, said rotor axis of said resolver belongs, and
   said calculator finds a final angle of said rotor axis of said resolver by setting an offset value of the calculated angle of said rotor axis based on the one of four quadrants determined by said discriminator.

2. An R/D converter in accordance with claim 1, where in said digital signal processor further includes:
   a memory configured to store values of a sampled sine wave with a designated sampling frequency, and output said stored values based on an address automatically generated; and
   a second converter configured to convert said stored values from said memory into an analog signal and outputting said analog signal as a sine wave for providing excitation of said resolver.

3. An R/D converter in accordance with claim 2, further comprising a filter for removing a high frequency component generated by quantizing the sine wave for excitation.

4. An R/D converter in accordance with claim 1, wherein said digital signal processor further includes:
   a memory configured to store values of a sampled sine wave with a designated sampling frequency, and outputting said stored values based on an address automatically generated; and
   a second converter configured to convert said stored values from said memory into an analog signal and output said analog signal as a sine wave for providing excitation of said resolver.

5. An R/D converter in accordance with claim 4, further comprising a filter for removing a high frequency component generated by quantizing the sine wave for excitation.

6. A Resolver/Digital (R/D) converter configured to find an angle of a rotor axis associated with a resolver, the R/D converter comprising:
   an analog to digital converter converting a sine wave and a cosine wave output from the resolver into a digitized sine wave and a digitized cosine wave respectively; and
   a Digital Signal Processor (DSP), configured to:
      calculate a tangent from the digitized sine wave and the digitized cosine wave; and
      calculate the angle of the rotor axis by digitally calculating an arc tangent directly from the calculated tangent, the calculated angle of the rotor axis being between 0 and 90 degrees;
   wherein the DSP is further configured to:
   determine a quadrant of the angle of the rotor axis, the quadrant determined from one of four 90° quadrants formed by dividing an angle space of 0° to 360° associated with the rotor axis by four; and
   determine a final value of the angle of the rotor axis by setting an offset value of the angle of said rotor axis based on the determined one of the four 90° quadrants.

7. An R/D converter in accordance with claim 6, wherein the DSP further includes:
   a memory configured to store values of a sine wave sampled with a designated sampling frequency, and output the stored values based on an automatically generated address; and
   a Digital to Analog (D/A) converter configured to convert the stored values output from the memory into an analog signal and output the analog signal as a sine wave for providing excitation of the resolver.

8. An R/D converter in accordance with claim 7, further comprising a filter for removing a high frequency component generated by quantizing the sine wave for excitation.

9. An R/D converter in accordance with claim 6, wherein the DSP further includes:

a memory configured to store values of a sine wave sampled with a designated sampling frequency, and output the stored values based on an automatically generated address; and a Digital to Analog (D/A) converter configured to convert the stored values output from the memory into an analog signal and output the analog signal as a sine wave for providing excitation of the resolver.

10. An R/D converter in accordance with claim 9, further comprising a filter for removing a high frequency component generated by quantizing the sine wave for excitation.

11. A Resolver/Digital (R/D) converter configured to find an angle of a rotor axis of a resolver, the R/D converter comprising:

a converter configured to convert a sine wave output and a cosine wave output associated with the resolver into a digitized sine wave output and a digitized cosine wave output respectively; and a processor configured to:
digitally calculate a tangent from the digitized sine wave output and the digitized cosine wave output;
directly calculate the angle of the rotor axis of the resolver by digitally calculating an arc tangent from the calculated tangent, the directly calculated angle being between 0 and 90 degrees;
determine to which one of four 90° quadrants the angle of the rotor axis belongs, the four quadrants formed by dividing an angle space of 0° to 360° associated with the rotor axis by four, using a polarity associated with the digitized sine wave output and the digitized cosine wave output respectively; and
set a final value of the angle of the rotor axis by applying one of four fixed offsets to the directly calculated angle, the one of the four fixed offsets associated with the determined one of the four 90° quadrants.

12. An R/D converter in accordance with claim 11, wherein the processor further includes:

a memory configured to:
store values of a sampled sine wave with a designated sampling frequency, and
output the stored values based on an automatically generated address; and a second converter configured to:
convert the stored values output from the memory into an analog signal, and
output the analog signal as a sine wave for providing excitation of the resolver.

13. An R/D converter in accordance with claim 12, wherein:
the processor further includes a counter coupled to the memory, and
the automatically generated address is generated by the counter.

14. An R/D converter in accordance with claim 13, further comprising a filter for removing a high frequency component generated by quantizing the sine wave for excitation.

15. An R/D converter in accordance with claim 13, wherein the processor includes a digital signal processor (DSP).

* * * * *